(12) United States Patent
Nadeau-Dostie et al.

(10) Patent No.: US 6,738,938 B2
(45) Date of Patent: May 18, 2004

(54) METHOD FOR COLLECTING FAILURE INFORMATION FOR A MEMORY USING AN EMBEDDED TEST CONTROLLER

(75) Inventors: Benoit Nadeau-Dostie, Aylmer (CA); Jean-François Côté, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 8 days.

(21) Appl. No.: 10/156,117

(22) Filed: May 29, 2002

(65) Prior Publication Data

US 2003/0226073 A1 Dec. 4, 2003

(51) Int. Cl.[7] .............................................. G11C 29/00
(52) U.S. Cl. ........................ 714/719; 714/718; 714/704
(58) Field of Search ................. 714/718, 719, 714/736, 704

(56) References Cited

U.S. PATENT DOCUMENTS

| | | | |
|---|---|---|---|
| 3,962,687 A | * | 6/1976 | Suzumura et al. |
| 4,369,511 A | * | 1/1983 | Kimura et al. |
| 4,969,148 A | | 11/1990 | Nadeau-Dostie et al. |
| 5,610,925 A | * | 3/1997 | Takahashi |
| 5,912,901 A | | 6/1999 | Adams et al. |
| 6,578,169 B1 | * | 6/2003 | Le et al. ...................... 714/736 |

* cited by examiner

Primary Examiner—Phung M. Chung
(74) Attorney, Agent, or Firm—Eugene E. Proulx

(57) ABSTRACT

A method of collecting failure information when testing a memory comprises performing a test of the memory according to a test algorithm, and, while performing the test, counting failure events which occur after a predetermined number of masked events; stopping the test upon occurrence of a stopping criterion which comprises one of occurrence of a first failure event, a change of a test operation; a change of a memory column address; a change of a memory row address; a change of a memory bank address; and a change of a test algorithm phase; and storing failure information.

52 Claims, 3 Drawing Sheets

METHOD FOR COLLECTING FAILURE INFORMATION FOR A MEMORY USING AN EMBEDDED TEST CONTROLLER

BACKGROUND OF THE INVENTION

1. Field of the Invention

The present invention relates to relates to a method for collecting failure information for memories tested using an embedded memory test controller.

2. Description of Related Art

Adams et al U.S. Pat. No. 5,912,901 granted on Jun. 15, 1999 for "Method and Built-in Self-test Apparatus for Testing an Integrated Circuit which Capture Failure Information for a Selected Failure" discloses a built-in self-test (BIST) apparatus and method for testing an integrated circuit which enables capture of failure data for a selected failure. The BIST apparatus comprises a clock generator, which generates at least a first clock signal, and a built-in self-tester, which applies predetermined input data patterns to the integrated circuit in response to the first clock signal. The BIST apparatus further includes a data comparator for comparing output data received from the integrated circuit with expected output data. The data comparator detects a failure within the integrated circuit when the output data received from the integrated circuit differs from the expected output data. The BIST apparatus also includes a clock controller that disables the first clock signal in response to the detection of a selected occurrence of a failure. By enabling testing of the integrated circuit to be halted upon the occurrence of a selected failure, failure analysis of the integrated circuit is enhanced.

Adams et al. suggest that the method can be used to capture all failure data of a memory by iteratively applying the method. However, collecting all information in this manner can be extremely time consuming and would collect failure information about repetitive failures that would not add any new information. By way of example, FIG. 2 illustrates a memory 10 which contains 64 words of two-bits each for a total of 128 bits. These bits are organized in arrays or banks 12 and 14. Each array has a number of rows and columns. Each bit of an array is accessed by applying a row address and a column address. In the example, three bits are used to access one of the eight rows and two bits are used to access one of the four groups of columns. Each bank is shown as arranged into two groups 16 and 18, each group having two groups of two columns (because words have two bits each). The bank address bit is used to select the bank to be accessed. Actual memories usually have many more rows and columns. The symbol 'X' in FIG. 2 indicates bits that appear to be defective after applying a test. In the first bank, Bank 0, all bits of column '10' of group 18 of Bank 0 are marked as defective. In the second bank, Bank 1, all bits of the fifth row (row '100') are marked as defective. However, the actual cause of these defects reside in the circuitry used to access the bits. For example, a defective bit line could be responsible for the first set of failures. A defective word line could be responsible for the second set of failures. It will be seen that collecting specific information about each of the individual errors which appear to be defective in this situation would not provide useful information. In real memories, it would be extremely time consuming to capture detailed information about all such failures just to conclude that the access to the entire column or row is defective. Thus, a different method is needed to minimize the amount of detailed information that needs to be captured without sacrificing the ability to identify the root causes of the failures.

Another limitation of the Adams et al method is that it assumes that all failures are repeatable, i.e., that if the same test is applied to a memory, the same failures will occur at the same bit locations. Unfortunately, this is often not the case especially when testing the memory at high speed. Even at reduced speed, some defects will cause failures to be intermittent. The Adams et al method will miss some of the failures in such situations.

SUMMARY OF THE INVENTION

The present invention seeks to provide a method of testing memories which provide failure information about a complete column, row, bank, etc., as well as detailed information about each individual failure. The method thus reduces considerably the amount of time required to collect failure information, but the information is much more useful in terms of determining the root cause of some errors.

One aspect of the present invention is generally defined as a method for collecting failure information when testing a memory, comprising: performing a test of the memory according to a test algorithm, and, while performing the test, counting failure events which occur after a predetermined number of masked events; stopping the test upon occurrence of a stopping criterion which comprises one of occurrence of a first failure event, a change of a test operation; a change of a memory column address; a change of a memory row address; a change of a memory bank address; and a change of a test algorithm phase; and storing failure information.

Another aspect of the present invention is generally defined as an improvement in a memory test controller for use in an integrated circuit for testing memory, the improvement comprising an event counter for counting predetermined events and responsive to a stopping criterion signal by generating a freeze signal, the event counter being responsive to an active failure signal for counting failure events; and control logic for controlling memory test operations, the control logic being operable for generating the stopping criterion signal and being responsive to the freeze signal for stopping the test controller test.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

Figure 1:
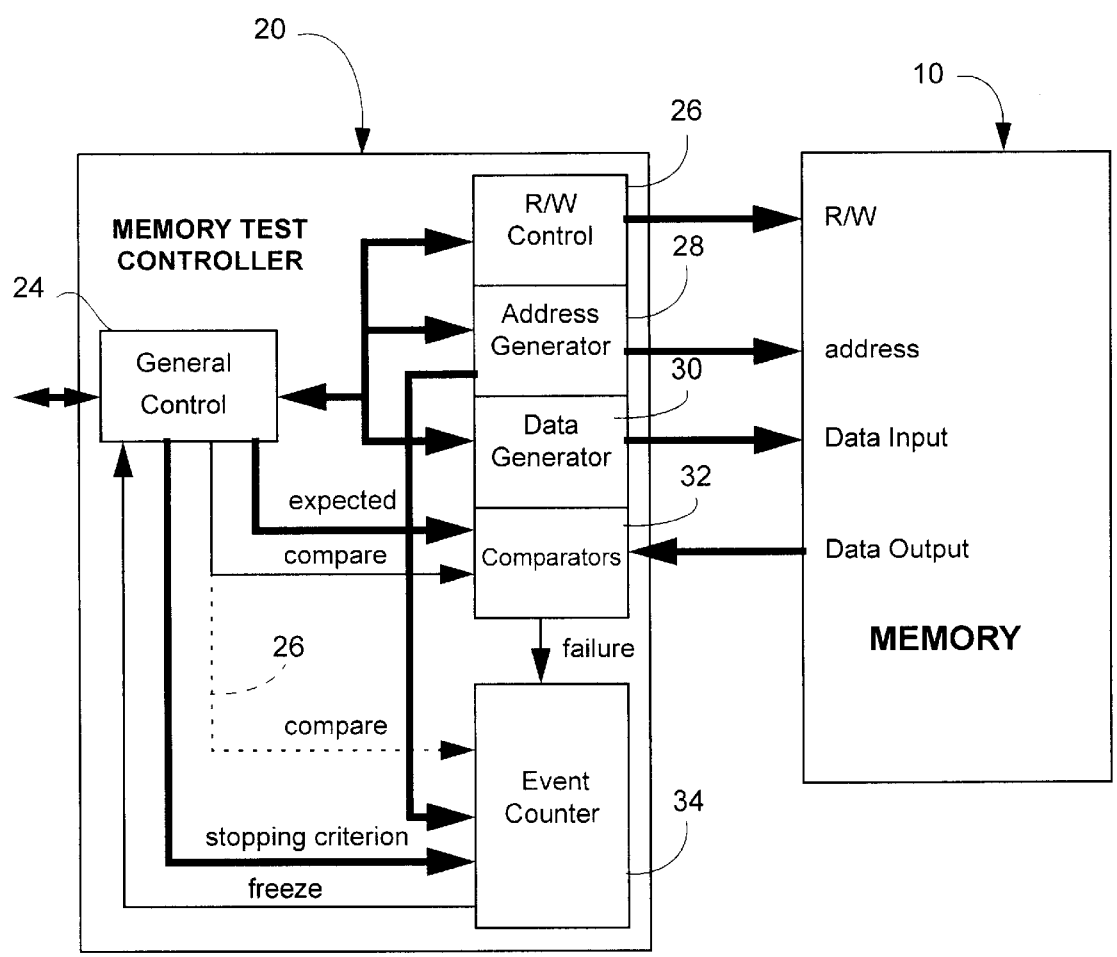
FIG. 1 illustrates a memory test controller architecture according to one embodiment of the present invention.

FIG. 1 shows an example of a memory test controller 20 connected to a memory 10. The memory test controller is typically embedded in an integrated circuit (not shown). The memory can be embedded in the same integrated circuit or could reside off-chip. The functional connections to the memory are not shown to simplify the figure. The memory test controller can be shared among several memories.

The memory test controller is comprised of several blocks. A general control block 24 interacts with all other blocks as well as with an external tester (not shown) either directly or through a test access port. In general, the interaction with the tester is limited to initiating a memory test and collecting failure information. Both operations require setting registers (a group of memory elements) of the test controller to appropriate values and reading registers containing relevant information after the execution of the memory test.

General control block 24 determines the sequence of read and write operations that are to be performed to test the memory. The interaction of the general control block with the R/W control block 26, address generator block 28, data generator block 30 and comparator block 32, as well as the connections between the memory test controller and the memory, are well known in the art and are not discussed here. The discussion is limited to event counter block 34 and its interaction with the other blocks.

Event counter 34 is used to count "masked" events. There are two types of events. A masked event can be a "failure event" or, optionally, a "compare event". A failure event occurs when a value output by the memory being tested is different from an expected value. A compare event occurs when a value output by the memory is compared with an expected value. As will be seen, this capability is useful in some circumstances.

The number of masked events is set for each failure or failure group that is being diagnosed. A failure group refers to the group of errors detected in an iteration of the method of the present invention. The event counter counts masked events until a predetermined number of events has been reached. At that point, the event counter starts counting failure events until a stopping criterion is satisfied. Several stopping criteria are possible and are explained later. Preferably, the event counter is of the type which counts down to 0 from a predetermined value and thereafter counts up until stopped. This avoids the need for a register to store the predetermined value and the comparator for comparing the current count against the predetermined value.

Event counter 34 receives a failure signal from comparators block 32. The counter can count the failure events indicated by an active value of the failure signal. A failure event always corresponds to a compare event. A compare event is triggered by a compare signal generated by general control block 14 and applied to comparators block 22. In one embodiment of the present invention, the compare signal is also applied to the event counter block. This optional connection is shown by a dotted line 26. When this option is implemented, the event counter will count the compare events up to the predetermined number of masked events described above. This option is very useful when failure events are not repeatable and the same sequence of read and write operations are re-applied to the memory.

Event counter 34 receives a stopping criterion signal from the general control block 24. The address, provided by the address generator 28, is used in conjunction with the stopping criterion to stop the counting of failure events. Once the stopping criterion is satisfied, the event counter outputs a freeze signal which is sent to the general control block which, in turn, will stop the controller. The controller can be stopped by either configuring memory elements in a hold mode or the clock applied to the test controller. Several registers of the controller are read to characterize a failure group. The state of the address generator indicates the address of the last failure of that failure group. The state of the general control block indicates the algorithm phase of that failure. The state of the comparators indicates the bit positions which generated failure events after the masked events. Finally, the event counter indicates the number of failure events during the same period.

When there are several comparators, an active failure signal is generated if any of the comparators indicate a failure. Some single bit failures might be masked by severe errors in memory words with the same column address. In order to address this problem, a selection mechanism can be added to the comparators block to only generate a failure event for specific bit positions within a word. The method can be repeated several times, selecting a different comparator or set of comparators each time.

One of the benefits of using an embedded test controller is that the clock rate used during the test can be substantially the same as that used during the normal operation of the circuit. It is an objective of this invention to be able to detect and diagnose all defects, including those that only manifest themselves at the normal operational clock rate.

The present invention takes advantage of the way the majority of memory test algorithms are applied. An algorithm is a sequence of read and write operations. Algorithms are often applied in a way that all bits in a row or a column group are accessed consecutively. A general way of expressing algorithms is as follows:

For each phase;
For each bank address;
For each row or column address;
For each column or row address;
For each operation;
Read or write data.

Typically, all words of the memory are accessed during a phase of an algorithm. All memory locations are accessed several times during the execution of an algorithm. The invention works best when all rows and columns of a bank are accessed before the bank address is changed. This is why the second loop of the algorithm is the bank address loop. Thus, all banks are accessed during a phase. The banks can be accessed in any order. There is a choice in loops which are subsidiary to the bank address loop. The algorithm can select a row address and then access all memory locations in the selected row by going through all column addresses and then move to the next row until all locations have been accessed. This access method is referred to herein as a row access mode. Another method is to select a column address and then access all memory locations in the selected column by going through all row addresses and then move to the next column until all locations have been accessed. This access method is referred to herein as a column access mode. For each combination of row and column address, one or more read/write operation can be performed.

Figure 2:
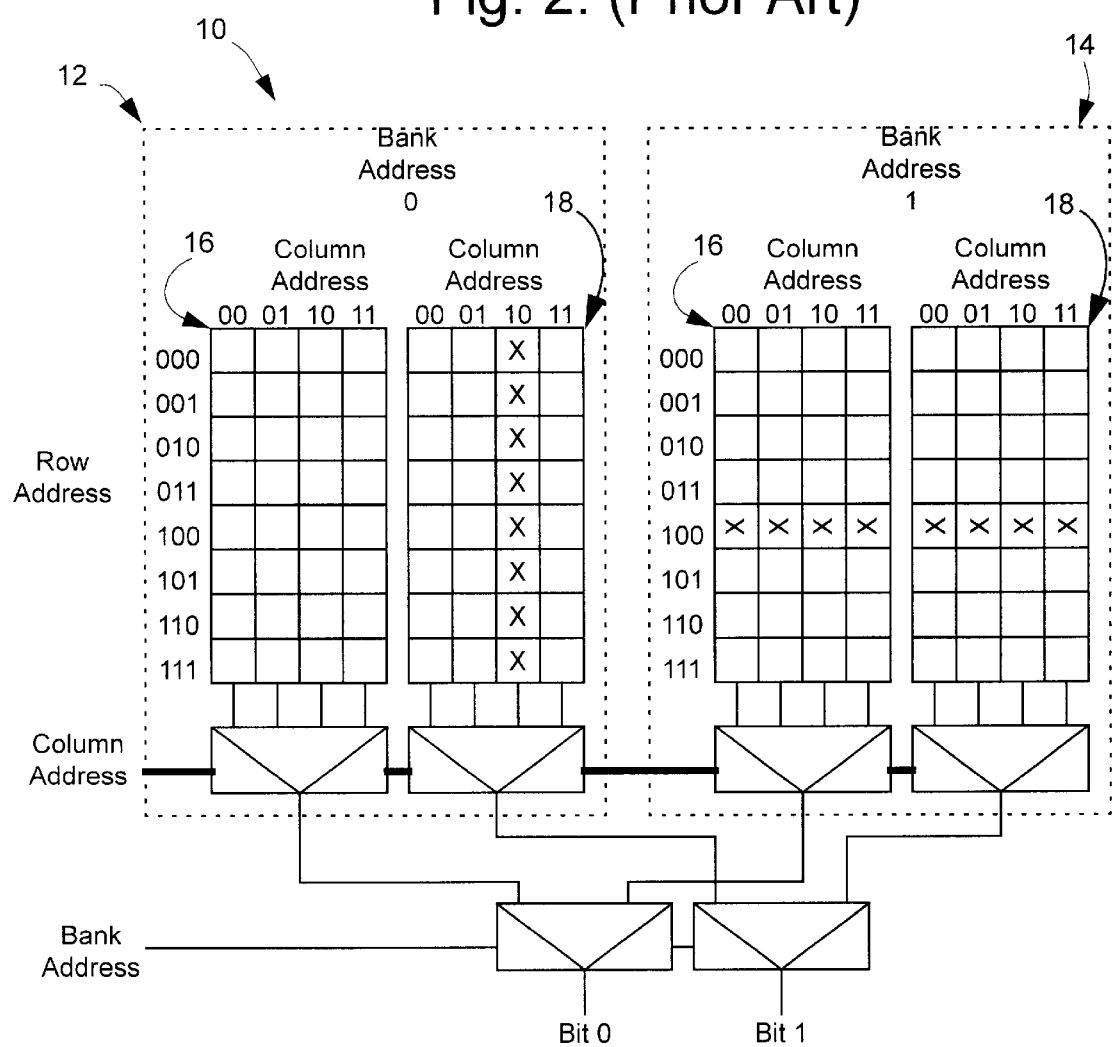
FIG. 2 illustrates a prior art memory configuration with a failure pattern example.

Suppose that the memory 10 of FIG. 2 is to be tested and that the test is in a column access mode phase of the algorithm, Bank 0 is tested first, and that the row and column address changes from 0 to their respective maximum values, and that the default stopping criterion used will be to stop the controller on the first failure encountered.

In the first iteration, the test proceeds without problems in group 16 and columns '00' and '01' of group 18. However, in column '10', a first error is encountered. The controller stops and detailed failure information about this first failure is collected by reading the state of the controller contained in various registers. The failure information may include, for example, the algorithm phase, the bank/row/column address, the operation being executed, and the comparator(s) that reported a failure. The failure information for this first failure group is collected and stored.

Subsequent iterations of the test can resume from either where the previous iteration stopped or from the beginning of the phase or from the beginning of the algorithm—whatever is most appropriate. One of these options is selected and the test controller is initialized accordingly. It will noted that it is not always possible to resume from the point at which the failure occurred because some problems can only be found by applying a continuous sequence of read/write operations without interruption. Algorithm phases are not always self-contained in the sense that they might assume that the previous phase left the memory in a certain state and that state was changed by write operations during the partial execution of the current phase. Therefore, resuming from the beginning of a current phase is not always possible. However, it is always possible to resume from the beginning of the algorithm. For the remaining portion of this example, it will be assumed that a test is resumed from the beginning of the algorithm.

When a test is resumed, the failures detected in previous iterations must be ignored or masked in order to collect information about the next failure. Event counter 34 provides this function. As indicated above, the event counter counts up to a predetermined number of masked events. These events are either failure events or compare events, depending on the design of the controller. In this example, the event counter is designed to count masked events which are failure events. Thus, the event counter would count one failure event and then wait until the second failure event is detected before issuing an active freeze signal to general control block 24. Alternatively, if the event counter is designed to count compare events, the counter would be initialized to count 17 "compare" events and then wait until the second failure is detected. The 17 compare events are the events associated the 16 row addresses in columns '00' and '01' and the first row address of column '10'. The second failure is immediately detected in the second row address of column '10'. The failure information for this second failure group is collected and stored.

After collecting and inspecting the test information for the second failure group, the user or diagnostic software may realize that the failure is in the same column as the failure in the first failure group and suspect massive failure of that column. This is where the stopping criterion comes into play. For the third iteration of collecting failure information, the test controller is initialized with a different stopping criterion. In accordance with the present invention, the stopping criterion is generalized to count the number of failures, which occur after the predetermined number of masked events, until one of the following occurs: a change in the operation; a change in the column address; a change in the row address; change in the bank address; a change of algorithm phase. There are three possibilities. The first and preferred possibility is to stop on occurrence of the first failure event following the occurrence of a change of the selected one of a test operation, memory column address; memory row address; memory bank address and a test algorithm phase. The second possibility is to stop on occurrence of a change in the selected one of a test operation; memory column address; memory row address; memory bank address; and test algorithm phase following a failure event which follows the predetermined number of masked events. The third possibility is simply to stop on occurrence of a change in the selected one of a test operation; memory column address; memory row address; memory bank address; and a test algorithm phase following the predetermined number of masked events.

Returning to the example, one may choose to count all failure events occurring after a predetermined number of masked events until a change of the column address occurs. The predetermined number of masked events would be two if only failure events are counted or 18 if compare events are counted. The number of failure events occurring after the masked events is six, assuming one compare event per address. The controller can stop at the last failure of the column or at the first failure encountered in Bank 1.

The number of failures counted is associated with the column in which the second failure occurred. If the number of failures is large, e.g., more than 25% of the bits in the column have failed, the column is declared bad and the defect causing these failures is deemed to be in the access infrastructure and not the bits themselves. In this example, it was possible to identify the problem in three iterations as opposed to eight for the method used in the prior art. Of course, the time savings are much more important for real memories that have hundreds of rows.

It is possible that the number of failures is relatively low meaning that more single bit or two-bit failures occurred. The failure count information alone might be sufficient to debug or characterize the memory. If not, it is possible to re-execute the test and change the stopping criterion to stop at each failure to obtain the row addresses of individual failures.

In the example so far, it was assumed that the failures occurred on a single comparator. However, if the two comparators captured failures, it might be necessary to re-execute the test to determine if both columns are completely bad or if one column is bad and the other has single bit or two-bit failures. As previously mentioned, a selection mechanism can be added to comparators block 32 to only generate a failure event for specific bit positions within a word. The method can be repeated several times selecting a different comparator each time.

Suppose that the memory test is in a phase of the algorithm using a row access mode and that Bank 1 is tested first. The first word accessed on row 5 will indicate a failure on both bits of the word. Based on that result, one can suspect a massive failure of the entire row. On the next iteration, the stopping criterion can be set so that failures are counted until a change in row occurs. In this case, it is expected that all comparators, or a large number of comparators when the number of bits per word is large, will capture failures. In two iterations, the method extracts the failure information needed. Again, the time savings are more important for real memories that have hundreds of columns.

Using a change on column address as the stopping criterion when testing the memory in row access mode OR using a change in row address as the stopping criterion when testing the memory in column access mode is useful to collect failure information about all operations applied to a word during a phase. An example of this situation would be when the present invention is used in conjunction with Nadeau-Dostie et al. U.S. Pat. No. 4,969,148 granted on Nov. 6, 1990 for "Serial Testing Technique for Embedded Memories", incorporated herein by reference. Operations are performed for each bit of a word. However, there are many other algorithms that require several operations on the same location.

The stopping criterion based on the change in bank address is useful when many failures are captured in a certain bank and these are not specific to a row or a column.

The problem is in the bank selecting infrastructure and, accordingly, there is no point in trying to collect information about individual bits, rows or columns.

The stopping criterion based on the change of algorithm phase is useful when a mixture of row and column failures occur. In this case, it is usually more efficient to test the memory in the column access mode and skip the phases that test the memory in the row access mode. This is because column failures can be collected more quickly in column access mode and row failures can still be collected in a reasonable time in that mode. This is because the number of column addresses is usually significantly smaller than the number of row addresses.

Summary of Method

Figure 3:
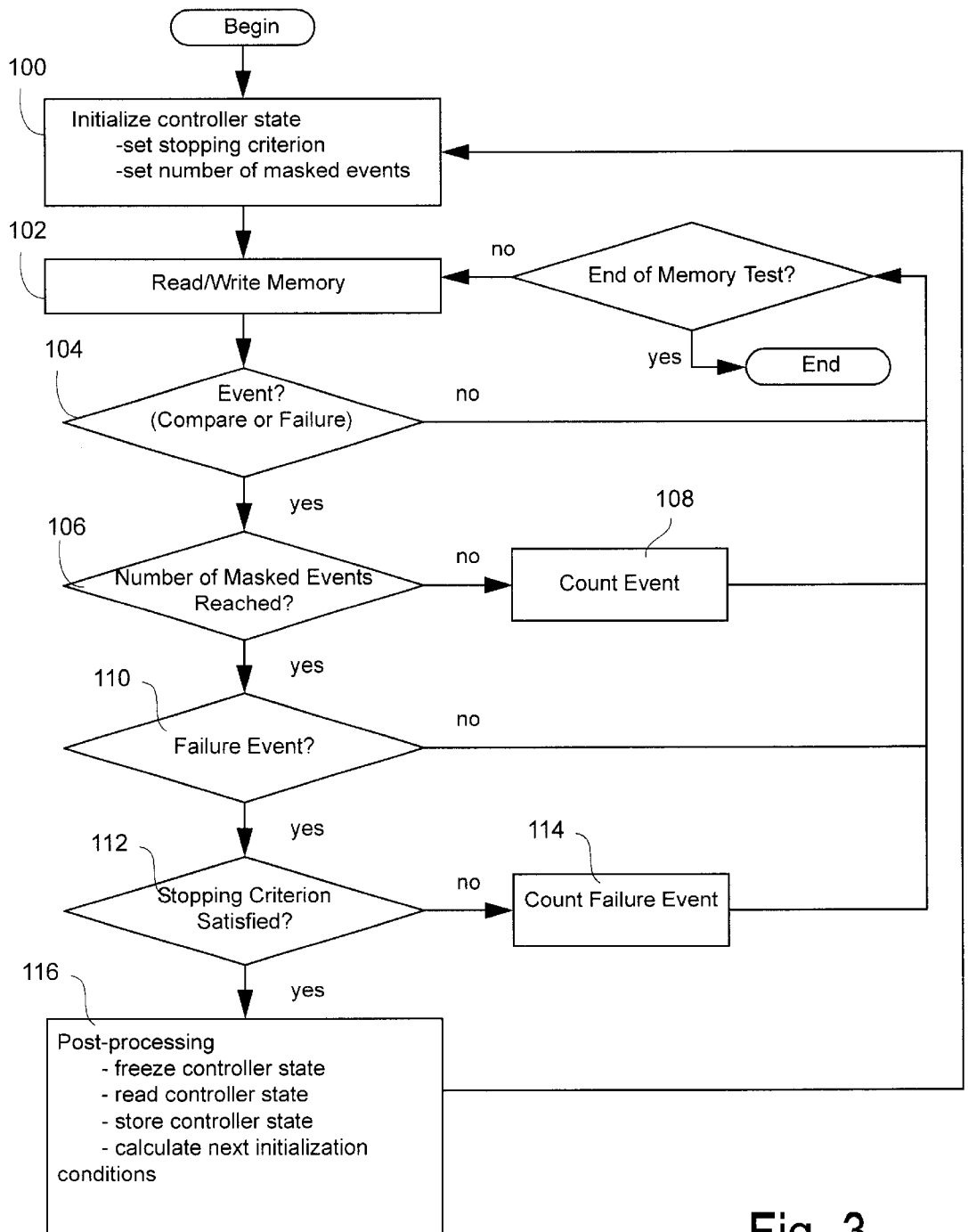
FIG. 3 is a flow diagram of the method according to an embodiment of the present invention.

The method of collecting failure information will now be summarized with reference to FIG. 3. According to the method of the present invention, for each failure group, the test controller is initialized at step 100 to set the initial state of the test. As previously mentioned, the initial state can be the state at which the last failure occurred, the beginning of an algorithm phase, or the beginning of the algorithm itself. The initialization step also involves selecting a stopping criterion and defining the number of masked events which will occur before applying the stopping criterion.

The memory test is applied at step 102 and involves applying a predetermined sequence of read and write operations according to a test algorithm, comparing memory output data to expected data during a compare event and generating a failure signal when the memory output data does not correspond to the expected data.

At step 104, the controller determines whether an event has occurred. An event may be a compare event or a failure event, depending on the design of the controller, as previously mentioned. If an event has occurred, the process proceeds to step 106 where the event counter checks if the predetermined number of masked events has been reached. If not, the event counter counts the event at step 108. If the predetermined number of events has been reached, the method proceeds to step 110 which determines whether the event was a failure event. If not, the memory test continues. If the event was a failure event, the controller determines at step 112 whether the selected stopping criterion is satisfied. If not, the event counter is incremented at step 114. If yes, the state of the memory test controller is frozen, and failure information is read out and stored at step 116. The information is used to calculate the next initialization conditions for the next failure group. In one embodiment, the calculation involves setting the number of masked events for the next failure group equal to the number of compare events up to the current failure group. In another embodiment, the calculation involves setting the number of masked events for the next failure group equal to the sum of the masked failure events and the failure events counted for the current failure group.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method for collecting failure information when testing a memory, comprising:
    performing a test of said memory according to a test algorithm, and, while performing said test, counting failure events which occur after a predetermined number of masked events;
    stopping said test upon occurrence of a stopping criterion which comprises one of occurrence of a first failure event, a change of a test operation; a change of a memory column address; a change of a memory row address; a change of a memory bank address; and a change of a test algorithm phase; and
    storing failure information.

2. A method as defined in claim 1, said stopping criterion being the first failure event following said occurrence of a change in one of a test operation; a memory column address; a memory row address; a memory bank address; and a test algorithm phase.

3. A method as defined in claim 2, said masked events being compare events in which a memory output is compared against an expected memory output.

4. A method as defined in claim 1, said stopping criterion being occurrence of a change in one of a test operation; a memory column address; a memory row address; a memory bank address; and a test algorithm phase following said predetermined number of masked events.

5. A method as defined in claim 1, said stopping criterion being occurrence of a change in one of a test operation; a memory column address; a memory row address; a memory bank address; and a test algorithm phase following the first failure event following said predetermined number of masked events.

6. A method as defined in claim 2, said masked events being failure events in which a memory output differs from an expected memory output.

7. A method as defined in claim 1, further including, following said storing test information, setting a value for said predetermined number of masked events for use in a following iteration of said method.

8. A method as defined in claim 7, further including, following said storing test information, setting a new stopping criterion for use in a following iteration of said method.

9. A method as defined in claim 1, said memory test including applying a predetermined sequence of read and write operations to said memory, comparing memory output data to expected data during a compare event, and generating a failure event when said memory output data does not correspond to said expected data.

10. A method as defined in claim 9, said memory having a predetermined number of data bits organized in rows and columns, said data bits being addressable by a combination of a row address and a column address during said predetermined sequence of read and write operations, further including selecting a stopping criterion in which the first failure occurs after a row address change or a column address change.

11. A method as defined in claim 10, further including, prior to performing said test, selecting a stopping criterion in which the first failure event occurs after a row change when said algorithm is in a row access mode.

12. A method as defined in claim 11, further including, selecting a stopping criterion in which the first failure event occurs after a column change when said algorithm is in a column access mode.

13. A method as defined in claim 9, when the sequence of read and write operations includes at least one phase in which all data words are accessed, and said stopping criterion being the first failure event occurring after a change in column address.

14. A method as defined in claim 9, said applying a predetermined sequence of read and write operations includes repeating the same said sequence for all iterations of said test.

15. A method as defined in claim 9, said applying a predetermined sequence of read and write operations includes beginning a test iteration from the point of the last failure event in the previous iteration.

16. A method as defined in claim 1, said predetermined number of masked events is 0.

17. A method as defined in claim 1, further including, prior to said performing a test, selecting one of said stopping criterion and specifying said predetermined number of masked events to occur before applying said stopping criterion.

18. A method as defined in claim 1, said predetermined number of masked events corresponding to a predetermined number of compare events.

19. A method as defined in claim 1, said predetermined number of masked events corresponding to a predetermined number of failure events.

20. A method as defined in claim 1, said memory having a predetermined number of data words which are addressable using a row and a column address, said stopping criterion being the first failure to occur after a row address change when said memory is being accessed in column access mode.

21. A method as defined in claim 1, said memory having a predetermined number of data words which are addressable using a row and a column address, said stopping criterion being the first failure to occur after a column address change when said memory is being accessed in row access mode.

22. A method as defined in claim 1, said memory being organized into banks and said stopping criterion being the first failure occurring following a change of bank.

23. A method as defined in claim 1, said stopping said test comprising configuring memory elements of a test controller in a hold mode.

24. A method as defined in claim 1, said stopping said test comprising stopping the clock applied to a test controller.

25. A method as defined in claim 1, said storing failure information comprising configuring memory elements of a test controller in a shift mode, and applying a predetermined number of clock cycles to shift out the contents of said memory elements.

26. A method as defined in claim 1, further including calculating initialization conditions for a following failure group, said calculating including calculating the number of masked events for the next failure group to be the number of compare events up to the last failure event.

27. A method as defined in claim 1, further including calculating initialization conditions for a following failure group, said calculating including calculating the number of masked events for the next failure group to be the sum of the masked failure events and the failure events counted for the current failure group.

28. A method for collecting failure information for a memory using an embedded test controller:
for each failure group:
initializing said test controller including selecting a stopping criterion and defining the number of masked events to occur before applying said stopping criterion;
applying a memory test including applying a predetermined sequence of read and write operations according to a test algorithm, comparing memory output data to expected data during a compare event and generating a failure event when said memory output data does not correspond to said expected data, and, while applying said memory test:
counting masked events up to a predetermined number of masked events and, thereafter counting failure events until said stopping criterion is met;
freezing the state of said memory test controller upon occurrence of said stopping criterion;
determining and storing the state of said memory test controller; and
calculating initialization conditions for the next failure group.

29. A method as defined in claim 28, said initializing including selecting a stopping criterion which comprises one of occurrence of a first failure event, a change of a test operation; a change of a memory column address; a change of a memory row address; a change of a memory bank address; and a change of a test algorithm phase.

30. A method as defined in claim 29, said stopping criterion being the first failure event following said occurrence of a change in one of a test operation; a memory column address; a memory row address; a memory bank address; and a test algorithm phase.

31. A method as defined in claim 29, said stopping criterion being occurrence of a change in one of a test operation; a memory column address; a memory row address; a memory bank address; and a test algorithm phase following the first failure event following said predetermined number of masked events.

32. A method as defined in claim 29, said stopping criterion being occurrence of a change in one of a test operation; a memory column address; a memory row address; a memory bank address; and a test algorithm phase following said predetermined number of masked events.

33. A method as defined in claim 28, said calculating initialization conditions for a following failure group including calculating the number of masked events for the next failure group to be the number of compare events up to the last failure event of a current failure group.

34. A method as defined in claim 28, said calculating initialization conditions for a following failure group including calculating the number of masked events for the next failure group to be the sum of the masked failure events and the failure events counted for a current failure group.

35. A method as defined in claim 28, said stopping criterion being the first failure to occur after a row address change when said memory is being accessed in column access mode.

36. A method as defined in claim 28, said stopping criterion being the first failure to occur after a row address change when said memory is being accessed in row access mode.

37. A method as defined in claim 28, said stopping criterion being the first failure to occur after a column address change when said memory is being accessed in column access mode.

38. A method as defined in claim 28, said stopping criterion being the first failure to occur after a column address change when said memory is being accessed in row access mode.

39. A method as defined in claim 28, said memory being organized in banks and said stopping criterion being the first failure occurring after a bank address change.

40. A method as defined in claim 28, said stopping criterion being the first failure which occurs after a row address change or a column address change.

41. A method as defined in claim 28, when the sequence of read and write operations includes at least one phase in which all data words are accessed, and said stopping criterion being the first failure occurring after a column change.

42. A method as defined in claim 28, the test associated with each subsequent failure group beginning from where the test of the previous failure group stopped.

43. A method as defined in claim 28, the test associated with each subsequent failure group beginning from the beginning of the algorithm phase at which the test for the previous failure group stopped.

44. A method as defined in claim 28, the test associated with each subsequent failure group beginning from the beginning of the algorithm.

45. A memory test controller for use in an integrated circuit for testing memory, the improvement comprising:

an event counter for counting predetermined events and for generating a freeze signal in response to a stopping criterion signal and a signal which satisfies said stopping criterion signal, said event counter being responsive to an active failure signal for counting failure events; and control logic for controlling memory test operations, said control logic being operable for generating said stopping criterion signal and being responsive to said freeze signal for stopping said test controller test.

46. A test controller as defined in claim 45, said event counter being further operable to count masked events when a count of said counter is less than or equal to a predetermined count value and operable to count failure events when said current count is greater than said predetermined count value.

47. A test controller as defined in claim 45, said event counter being operable to count down to 0 from a predetermined value and thereafter count up until stopped.

48. A test controller as defined in claim 46, said masked events being failure events which occur when said count is less than said predetermined count value.

49. A test controller as defined in claim 46, said masked events being compare events which occur when a memory output is compared against an expected memory output and said count is less than said predetermined count value.

50. A test controller as defined in claim 45, said control logic being responsive to an active freeze signal by configuring test controller memory elements in a hold mode.

51. A test controller as defined in claim 45, said control logic being responsive to an active freeze signal by stopping the clock applied to a test controller.

52. A test controller as defined in claim 45, said signal which satisfies said stopping criterion signal being a signal indicating occurrence of a first failure event, a signal indicating a change of a test operation; a signal indicating a change of a memory column address; a signal indicating a change of a memory row address; a signal indicating a change of a memory bank address; or a signal indicating a change of a test algorithm phase.

* * * * *